United States Patent [19]

Shiomi et al.

[11] Patent Number: 5,400,738
[45] Date of Patent: Mar. 28, 1995

[54] METHOD FOR PRODUCING SINGLE CRYSTAL DIAMOND FILM

[75] Inventors: Hiromu Shiomi; Takahiro Imai; Naoji Fujimori, all of Itami, Japan

[73] Assignee: Sumitomo Electric Industries, Ltd., Osaka, Japan

[21] Appl. No.: 987,557

[22] Filed: Dec. 8, 1992

Related U.S. Application Data

[63] Continuation of Ser. No. 758,423, Sep. 3, 1991, abandoned, which is a continuation of Ser. No. 488,954, Mar. 5, 1990, abandoned.

[30] Foreign Application Priority Data

Mar. 7, 1989 [JP] Japan .................... 1-54476

[51] Int. Cl.$^6$ .................................... C30B 29/04
[52] U.S. Cl. .......................... 117/84; 117/88; 117/919; 117/929
[58] Field of Search ............ 156/610, 611, 612, 613, 156/614; 423/446

[56] References Cited

U.S. PATENT DOCUMENTS 3,630,678 12/1971 Gardner ................. 156/613
3,961,103 6/1976 Aisenberg ............... 423/446

FOREIGN PATENT DOCUMENTS

| 0282054 | 9/1988 | European Pat. Off. . |
| 282075 | 9/1988 | European Pat. Off. ........ 423/446 |
| 0282075 | 9/1988 | European Pat. Off. . |
| 154965 | 7/1984 | Japan ................ 423/446 |
| 0154965 | 7/1984 | Japan . |
| 0164607 | 9/1984 | Japan ................ 423/446 |
| 0127298 | 7/1985 | Japan ................ 423/446 |
| 191097 | 9/1985 | Japan ................ 423/446 |
| 60-191097 | 2/1986 | Japan . |
| 61-158899 | 12/1986 | Japan . |
| 61-183198 | 1/1987 | Japan . |
| 62-70295 | 8/1987 | Japan . |
| 2352295 | 10/1987 | Japan ................ 423/446 |
| 63-21291 | 1/1988 | Japan . |
| 63-2897 | 6/1988 | Japan . |
| 63-252997 | 10/1988 | Japan . |

OTHER PUBLICATIONS

"Electrical characteristics of Schottky diodes fabricated using plasma assisted chemical vapor deposited diamond films"; Gildenblatt et al; Appl. Phys. Letts. 53(7); Aug. 15, 1988; pp. 586–588.

"High Temperature Point-Contact Transistors and Schottky diodes Formed on Synthetic Boron–Doped Diamond"; Geis, et al.; IEEE Electron Device Letters, vol. EDL-8, No. 8; Aug. 1987; pp. 341–343.

"High Temperature Schottky Diodes With Boron—Doped Homoepitaxial Diamond Base"; Glidenblat et al; Mat. Res. Bull., vol. 25 pp. 129–134 (1990).

T. Kawato et al., Effects of Oxygen on "CUD Diamond Synthesis", Japanese Journal of Applied Physics, vol. 26, No. 9, (Sep. 1987) pp. 1429–1432.

C.-P. Chang, "Diamon Crystal Growth by Plasma Chemical Vapor Deposition", Journal of Applied Physics vol. 63, No. 5, (Mar. 1, 1988), pp. 1744–1748.

N. Fujimori et al. "Characterization of Conducting Diamond Films", Vacuum, vol. 36, No. 1-3, (1986), pp. 99–102.

Primary Examiner—R. Bruce Breneman
Assistant Examiner—Felisa Garrett
Attorney, Agent, or Firm—Cushman Darby & Cushman

[57] ABSTRACT

A single crystal diamond film having good crystallinity and electrical and optical characteristics is produced by a method which comprises steps of decomposing a raw material gas comprising a hydrogen gas, a carbon containing compound and an oxygen-containing compound and growing a single crystal diamond film on a substrate in a vapor phase.

4 Claims, 2 Drawing Sheets

METHOD FOR PRODUCING SINGLE CRYSTAL DIAMOND FILM

This is a continuation of application Ser. No. 07/758,423, filed on Sep. 3, 1991, which was abandoned upon the filing hereof, which is a continuation of application Ser. No. 07/488,954, filed Mar. 5, 1990, now abandoned.

BACKGROUND OF THE INVENTION

1. Field of the Invention

The present invention relates to a method for producing a single crystal diamond film. In particular, the present invention relates to a method for producing a single crystal diamond film having good crystallinity, a smooth surface, and good electrical and optical characteristics.

2. Description of the Related Art

Diamond has a large forbidden band width, a large electron mobility, a large hole mobility, a large saturation electron mobility, a large thermal conductivity, a low dielectric constant and high clarity. Therefore, the diamond is highly expected as a material for semiconductors, for example, semiconductive elements having heat resistance and radiation resistance and high speed high output semiconductive elements, and as an element for emitting blue light or UV light.

Recently, R. Mania et al proposed a method for synthesizing diamond in a vapor phase which comprises decomposing and exciting a raw material comprising a hydrocarbon gas such as methane with radiofrequency discharge (R. Mania et al, Crystal Research and Technology, 16, 785 (1981)).

The semiconductor field requires not only a diamond single crystal having high purity and crystallinity, but also one that has good crystallinity and contains a suitable amount of a certain impurity (dopant) with which valence electrons can be controlled.

It was confirmed that the single crystal diamond film can be grown on a diamond single crystal which has been synthesized under ultra-high pressure and that when the single crystal diamond is doped with an impurity such as boron acts as a p-type semiconductor (N. Fujimonri et al, Vacuum, 36, 99 (1986)).

When the impurity is doped by a conventional method for growing a single crystal diamond film by using a hydrocarbon gas and a hydrogen gas, a surface in, for example, the (110) plane has large irregularity so that the diamond crystal abnormally grows on the (110) plane. With respect to the electrical characteristics of the semiconductive element, when a Schottky diode is fabricated, it has a large reverse direction leak current.

SUMMARY OF THE INVENTION

An object of the present invention is to provide a method for producing a single crystal diamond film having a smooth surface, good crystallinity, and improved electrical characteristics.

Accordingly, the present invention provides a method for producing a single crystal diamond film, which comprises steps of decomposing a raw material gas comprising a hydrogen gas, a carbon-containing compound and an oxygen-containing compound and growing a single crystal diamond film on a substrate in a vapor phase.

The method of the present invention is particularly useful when the raw material contains a dopant.

DETAILED DESCRIPTION OF THE DRAWINGS

Figure 1:
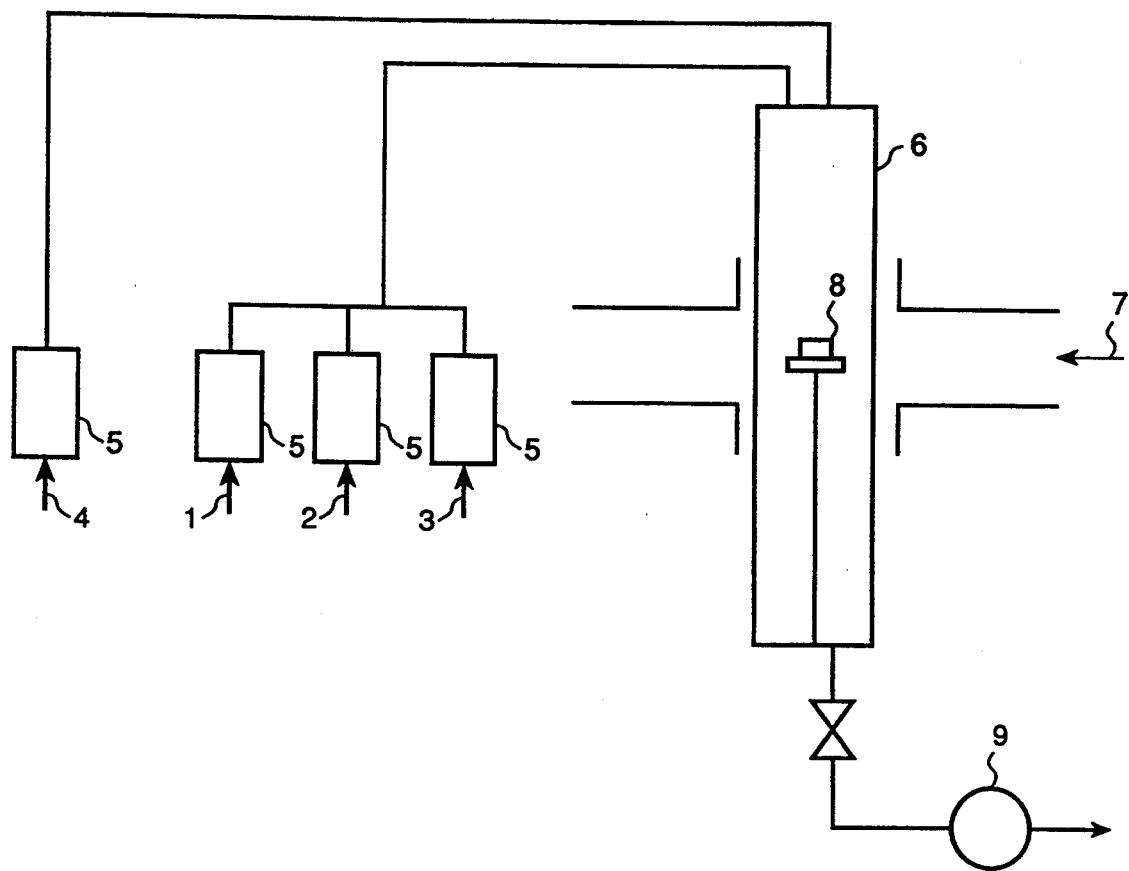
FIG. 1 schematically shows a preferred embodiment of a CVD apparatus for carrying out the method of the present invention.

The raw material to be used according to the present invention comprises a hydrogen gas, a carbon-containing compound, an oxygen-containing compound and optionally a dopant and is supplied to a reaction chamber in a vapor phase. The raw material is preferably diluted with an inert gas.

Specific examples of the carbon-containing compound are paraffinic hydrocarbons (e.g. methane, ethane, propane, butane, etc.), olefinic hydrocarbons (e.g. ethylene, propylene, butylene, etc.), acetylene type hydrocarbons (e.g. acetylene, allylene, etc.), dienes (e.g. butadiene, etc.), alicyclic hydrocarbons (e.g. cyclopropane, cyclobutane, cyclopentane, cyclohexane, etc.), aromatic hydrocarbons (e.g. cyclobutadiene, benzene, toluene, xylene, naphthalene, etc.), ketones (e.g. acetone, diethyl ketone, benzophenone, etc.), alcohols (e.g. methanol, ethanol, etc.), amines (e.g. trimethylamine, triethylamine, etc.), carbon monoxide, carbon dioxide, and mixtures thereof. Further, the carbon-containing compound may be a compound consisting of carbon atoms such as graphite, coal and coke.

As the oxygen-containing compound, oxygen, water, carbon monoxide, carbon dioxide and hydrogen peroxide are preferable since they are easily available.

When carbon monoxide or carbon dioxide is used, other carbon-containing compound is not necessarily used.

The inert gas includes argon, helium, neon, krypton, xenon and radon.

As the dopant, elemental boron, lithium, nitrogen, phosphorus, sulfur, chlorine, arsenic or selenium and their compounds can be used.

In the raw material, the moles of the hydrogen gas (A), the inert gas (B), the carbon atoms contained in the carbon-containing compound (C) and the oxygen atoms contained in the oxygen-containing compound (D) preferably satisfy the following equations:

$$0.02 \leq C/(A+B+C+D) < 0.5$$

and $$0.01 \leq D/C \leq 1.$$

When the ratio: $C/(A+B+C+D)$ is less than 0.02, the surface of the diamond film tends to lose its smoothness. When this ratio is 0.5 or larger, the graphite component tends to deposit.

When the ratio: $D/C$ is less than 0.01, the crystallinity of the diamond film tends to decrease. When this ratio is larger than 1 (one), the formation of the diamond film may be inhibited.

As the substrate, not only the single crystal diamond but also a substrate a lattice constant (a) of which satisfies the following relation can be used:

$$|(a - a_0)/a| \times 100 \leq 20$$

in which $a_0$ is the lattice constant of the single crystal diamond (=3.567 Å) and a is a lattice constant of the substrate. Examples of such substrate material are magnesium oxide (a: 4.213 Å), Ni (a: 3.524 Å), Cu (a: 3.6147 Å), Ni/Cu alloy, $\beta$-SiC (a: 4.36 Å), $\alpha$-SiC (a: 3.0807 Å), C-BN (a: 3.615 Å), AlN (a: 3.104 Å), PbTiO$_3$ (a: 3.90 Å), Ba$_2$TiO$_4$ (a: 3.994 Å), GaN (a: 3.180 Å), ZnO (a: 3.2407 Å), ZnS (a: 3.820 Å), ZrO$_2$ (a: 3.64 Å), oxide superconductive materials such as Tl$_2$Ba$_2$Ca$_2$Cu$_3$O$_{10}$ (a: 3.85 Å) or Y$_1$Ba$_2$Cu$_3$O$_{7-x}$ (a: 3.89 Å) and the like.

The vapor deposition of diamond can be carried out by a conventional method such as microwave plasma CVD (chemical vapor deposition), thermal filament CVD, RF plasma CVD, DC plasma CVD, plasma jet, chemical transportation, and the like. Among them, the plasma CVD using alternating current of 1 KHz or larger, particularly microwave plasma CVD is preferred, since the deposited diamond is less contaminated with impurities from a reaction chamber.

The pressure in the reaction chamber is usually from $10^{-4}$ to $10^3$ Torr.

The temperature of the substrate depends on the kind of substrate. Preferably, it is from 700° to 1000° C.

To synthesize the single crystal diamond film having a smooth surface and good electrical characteristics, the diamond is epitaxially grown in a state in which a degree of supersaturation of the carbon-containing compound in the vapor phase is large and which is close to the thermodynamic equilibrium. When the supply amount of the carbon-containing compound is increased to increase the degree of supersaturation, the graphite component contaminates the deposited diamond film or deposits in the reaction chamber to change the process conditions, although the film smoothness of the deposited diamond is improved. When the oxygen-containing compound is added to the carbon-containing compound, the former is decomposed to generate oxygen radicals or hydroxyl radicals. These radicals accelerate the decomposition of the carbon-containing compound and react selectively with the by-produced graphite to remove it. Then, the addition of the oxygen-containing compound makes it possible to synthesize the single crystal diamond film in the supersaturated state of the carbon-containing compound in the vapor phase, whereby the single crystal diamond having the smooth surface and good electrical and optical characteristics can be produced.

The method of the present invention will be illustrated by making reference to the accompanying drawings.

FIG. 1 schematically shows a preferred embodiment of an apparatus for carrying out the method of the present invention. Hydrogen gas 1, methane gas 2 as the carbon-containing compound and diborane gas 3 are metered with respective mass flowmeters 5, mixed and then supplied in a reaction chamber 6. Oxygen gas 5 as the oxygen-containing compound is metered with a mass flowmeter 5 and then supplied in the reaction chamber 6 through a supply line different from one for supplying the above mixture since the oxygen gas reacts with diborane. The gas mixture is decomposed in the chamber 6 with microwave 7. Carbon atoms generated through decomposition of methane is heated to several hundred degree (°C.) and reaches a single crystal diamond substrate 8 to form a diamond layer and a graphite layer. The graphite layer is removed through reaction of carbon with hydrogen atoms generated by the decomposition of hydrogen or oxygen atoms generated by the decomposition of oxygen. The reaction chamber 6 is evacuated with a vacuum pump 9.

Figure 2:
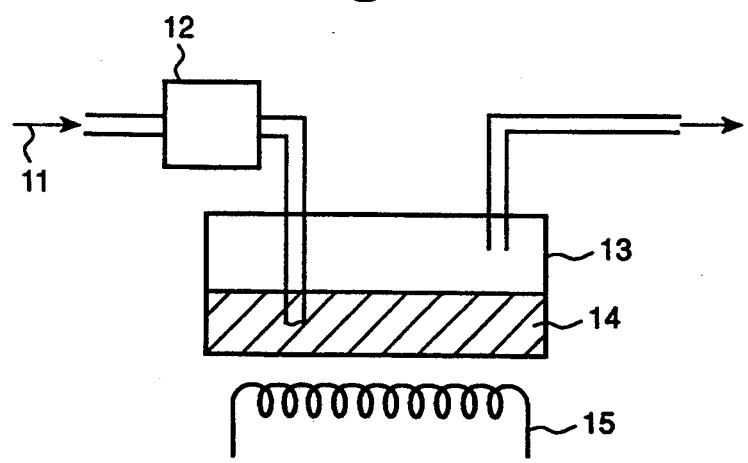
FIG. 2 is a cross section of a device for supplying a liquid material to the reaction chamber in a vapor state.

FIG. 2 is a cross section of a device for supplying a liquid material such as water and methanol to the reaction chamber in a vapor state. The hydrogen gas 11 is metered with the mass flow meter 12 and flowed through a liquid material 14 contained in a glass vessel 13. The liquid material 14 is entrained with the hydrogen gas flow and supplied in the reaction chamber. To increase the supply amount of the liquid material, the vessel 13 can be heated with a heater 15.

PREFERRED EMBODIMENTS OF THE INVENTION

The present invention will be explained further in detail by following examples.

Example 1 and Comparative Examples 1 and 2

A single crystal diamond film was grown by using the apparatus of FIG. 1. The reaction chamber was made of quartz and had an inner diameter of 44 mm and a length of 600 mm. As a substrate, a diamond single crystal of 1.5 mm in length, 2.0 mm in width and 0.3 mm in thickness was used with the (100) plane forming a deposition surface. As the raw material, a mixture of methane, hydrogen, diborane and oxygen in a molar ratio of Table 1 (Example 1) or a mixture of methane, hydrogen and diborane in a molar ratio of Table 1 (Comparative Examples 1 and 2) was used. The total flow rate of the raw material was 100 sccm. The microwave having a frequency of 2.45 Hz and power of 300 W was used. The deposited diamond film had a thickness of about 1 $\mu$m. Other reaction conditions are shown in Table 1.

TABLE 1

| Example No. | 1 | Comp. 1 | Comp. 2 |
|---|---|---|---|
| Raw material (mole %) | H$_2$ 89% CH$_4$ 10% B$_2$H$_6$ 20 ppm O$_2$ 1% | H$_2$ 99% CH$_4$ 1% B$_2$H$_6$ 20 ppm | H$_2$ 90% CH$_4$ 10% B$_2$H$_6$ 20 ppm |
| Pressure (Torr) | 40 | 40 | 40 |
| Substrate temp. (°C.) | 830 | 830 | 830 |
| Reaction time (hrs) | 2 | 2 | 2 |

In Comparative Example 1, although the good quality diamond film containing no graphite component was produced, the surface roughness was about 2000 Å. When the amount of methane was increased as in Comparative Example 2, although the diamond film having surface roughness of less than 100 Å was produced, the presence of the amorphous component was confirmed by electron diffraction analysis.

In Example 1, the diamond film had surface roughness of less than 100 Å and the electron diffraction gave a streak pattern which indicates a single crystal having uniformity in the atomic level.

Electrodes were formed on the obtained diamond film to assemble a Schottky diode. The characteristics of the diode were evaluated from a forward direction current If and a reverse direction leak current Ir in the diode.

Figure 3:
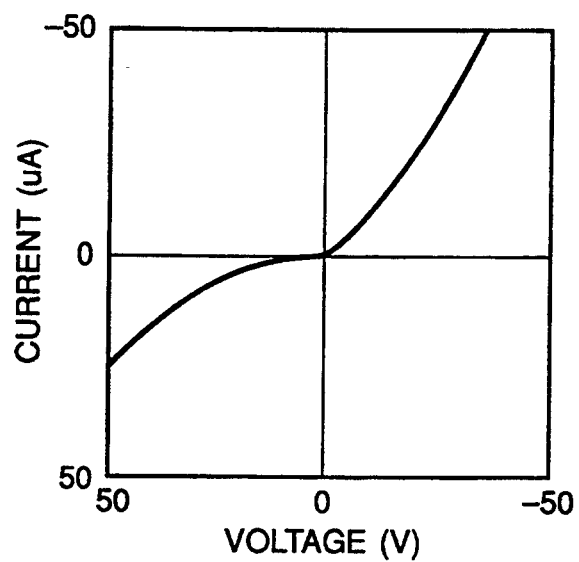
FIGS. 3, 4 and 5 show diode characteristics of the diodes fabricated from the diamond films obtained in Comparative Examples 1 and 2 and Example 1, respectively.
Figure 4:
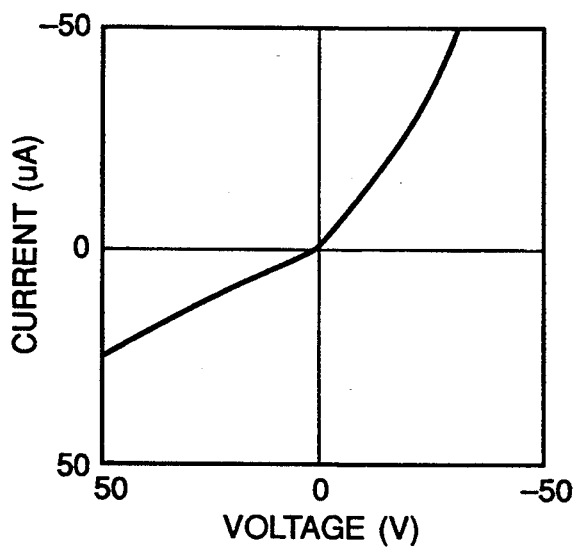

With the diode which was fabricated from the diamond film obtained in Comparative Example 1 or 2, an amount of Ir is more than one tenth of If, and no good rectification was achieved. The diode characteristics in Comparative Examples 1 and 2 are shown in FIGS. 3 and 4, respectively.

With the diode which was fabricated from the diamond film obtained in Example 1, an amount of Ir was less than one thousandth of If, and good rectification was achieved. The diode characteristics in Example 1 is shown in FIG. 5.

The properties of the deposited diamond films in Example 1 and Comparative Examples 1 and 2 are summarized in Table 2.

TABLE 2

Figure 5:
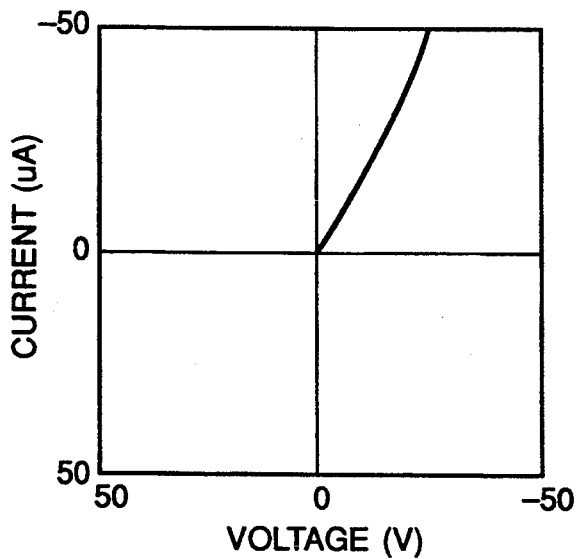

| Example No. | 1 | Comp. 1 | Comp. 2 |
|---|---|---|---|
| Surface roughness (Å) | <100 | ca. 2000 | <100 |
| Crystallinity | Complete single crystal | Partly crystallized | Partly amorphous |
| Electron diffraction pattern | Streak patter | Streak pattern + ring patter | Halo pattern |
| Diode characteristics | Ir<If/1000 see FIG. 5 | Ir>If/10 see FIG. 3 | Ir>If/10 see FIG. 4 |

Example 2 and Comparative Example 3

(Example 2)

In the same manner as in Example 1 but supplying hydrogen gas at 100 sccm, methane at 10 sccm, diborane (diluted with hydrogen to 10 ; ppm) at 10 sccm and carbon dioxide at 2 sccm in the reaction chamber and reacting them at a substrate temperature of 830° C. under pressure of 40 Torr for 2 hours to deposit a diamond film of 1.2 μm in thickness. The diamond film was a single crystal with good crystallinity and surface roughness of less than 100 Å, and had high hole mobility of about 1000 $cm^2/V.sec$. A Schottky diode fabricated from this diamond film achieved good rectification.

(Comparative Example 3)

In the same manner as above but using no carbon dioxide, a diamond film was deposited on the substrate. The diamond film contained a graphite component and had neither good crystallinity nor electrical characteristics.

Example 3 and Comparative Example 4

(Example 3)

In the same manner as in Example 1 but supplying hydrogen gas at 100 sccm, methane at 10 sccm, diborane (diluted with hydrogen to 10 ppm) at 10 sccm and carbon monoxide at 3 sccm in the reaction chamber and reacting them at a substrate temperature of 830° C. under pressure of 40 Torr for 2 hours to deposit a diamond film of 1.5 μm in thickness. The diamond film was a single crystal with good crystallinity and surface roughness of less than 100 Å, and had high hole mobility of about 1000 $cm^2/V.sec$. A Schottky diode fabricated from this diamond film achieved good rectification.

(Comparative Example 4)

In the same manner as above but using no carbon monoxide, a diamond film was deposited on the substrate. The diamond film contained a graphite component and had neither good crystallinity nor electrical characteristics.

Example 4 and Comparative Example 5

(Example 4)

In the same manner as in Example 1 but supplying hydrogen gas at 100 sccm, argon at 50 sccm, methane at 15 sccm, diborane (diluted with hydrogen to 10 ppm) at 10 sccm and oxygen at 2 sccm in the reaction chamber and reacting them at a substrate temperature of 850° C. under pressure of 80 Torr for 2 hours to deposit a diamond film of 2 μm in thickness. The diamond film was a single crystal with good crystallinity and surface roughness of less than 100 Å, and had high hole mobility of about 1000 $cm^2/V.sec$. A Schottky diode fabricated from this diamond film achieved good rectification.

(Comparative Example 3)

In the same manner as above but using no oxygen, a diamond film was deposited on the substrate. The diamond film contained a graphite component and had neither good crystallinity nor electrical characteristics.

Since the supply of the inert gas in the reaction chamber stabilizes the supersaturation of the carbon-containing compound in the vapor phase, the diamond with good quality can be epitaxially grown at a growth rate at least twice larger than in case of the absence of the inert gas.

Example 5 and Comparative Example 6

(Example 5)

In the same manner as in Example 1 but supplying hydrogen gas at 100 sccm in total, methane at 10 sccm, diborane (diluted with hydrogen to 10 ppm) at 10 sccm and water at 2 sccm (as converted to a saturated vapor pressure) in the reaction chamber and reacting them at a substrate temperature of 830° C. under pressure of 40 Torr for 2 hours to deposit a diamond film of 1.1 μm in thickness. To supply water, the device of FIG. 2 was used. The diamond film was a single crystal with good crystallinity and surface roughness of less than 100 Å, and had high hole mobility of about 1000 $cm^2/V.sec$. A Schottky diode fabricated from this diamond film achieved good rectification.

(Comparative Example 6)

In the same manner as above but using no water, a diamond film was deposited on the substrate. The diamond film contained a graphite component and had neither good crystallinity nor electrical characteristics.

Example 6 and Comparative Example 7

(Example 6)

In the same manner as in Example 1 but supplying hydrogen gas at 100 sccm in total, methanol at 8 sccm (as converted to a saturated vapor pressure), diborane (diluted with hydrogen to 10 ppm) at 10 sccm and oxygen at 1 sccm in the reaction chamber and reacting them at a substrate temperature of 830° C. under pressure of 40 Torr for 2 hours to deposit a diamond film of 1.5 μm in thickness. The diamond film was a single crystal with good crystallinity and surface roughness of less than 100 Å, and had high hole mobility of about 1000 $cm^2/V.sec$.

A Schottky diode fabricated from this diamond film achieved good rectification.

(Comparative Example 7)

In the same manner as above but using no oxygen, a diamond film was deposited on the substrate. The diamond film contained a graphite component and had neither good crystallinity nor electrical characteristics.

When the alcohol, is used as the carbon source, the high quality diamond film can be epitaxially grown at low cost.

Example 7 and Comparative Example 8

(Example 7)

In the same manner as in Example 1 but using a MgO substrate with the (100) plane forming the deposition surface, supplying hydrogen gas at 50 sccm, argon at 50 sccm, methane at 10 sccm, diborane (diluted with hydrogen to 10 ppm) at 10 sccm and oxygen at 2 sccm in the reaction chamber and reacting them at a substrate temperature of 800° C. under pressure of 40 Torr for 2 hours to deposit a diamond film of 0.9 μm in thickness. The diamond film was a single crystal with good crystallinity and surface roughness of less than 100 Å. A Schottky diode fabricated from this diamond film achieved good rectification.

(Comparative Example 8)

In the same manner as above but using no oxygen, a diamond film was deposited on the substrate. The MgO substrate was partly reduced, and the diamond film contained a graphite component and had no good crystallinity.

According to the present invention, the single crystal diamond film with good crystallinity and a smooth surface can be epitaxially grown on the single crystal substrate, and the high quality single diamond, which has been obtained from a natural source or by the ultrahigh pressure method, can be easily synthesized by the vapor deposition method. The electric device fabricated from the diamond film produced according to the present invention has good electrical characteristics and is ambient resistance.

When the diamond film has a large thickness, it can be used as an optical element or a heat sink. Since a large size diamond particle can be produced with keeping good crystallinity, abrasive particles or a jewel can be prepared.

What is claimed is:

1. A method for producing a single crystal diamond film for a Schottky diode, which comprises steps of:
   (a) decomposing a raw material gas comprising a hydrogen gas, a carbon containing compound, a dopant, and an oxygen containing compound, wherein said oxygen containing compound is at least one compound selected from the group consisting of oxygen, water and hydrogen peroxide, and wherein said dopant is selected from the group consisting of elemental boron, lithium, nitrogen, phosphorus, sulfur, chloride, arsenic, selenium, and their compounds; and
   (b) growing a single crystal diamond film on a substrate in a vapor phase, wherein the single crystal diamond film has a surface roughness less than 100 Å, and wherein the substrate is a single crystal diamond having a (100) surface and the film is grown on the (100) plane of the substrate.

2. The method according to claim 1, wherein the carbon-containing compound is a hydrocarbon.

3. The method according to claim 2, wherein the hydrocarbon is at least one selected from the group consisting of methane, ethane, propane, butane, ethylene, propylene, butylene, acetylene, allylene, butadiene, cyclopropane, cyclobutane, cyclopentane, cyclohexane, cyclobutadiene, benzene, toluene, xylene and naphthalene.

4. The method according to claim 1, wherein the raw Material is diluted with an inert gas selected from the group consisting of argon, helium, neon, krypton, xenon and radon, and wherein the molar amounts of the hydrogen gas (A), the inert gas (B), the carbon atoms contained in the carbon containing compound (C) and the oxygen atoms contained in the oxygen containing compound (D) preferably satisfy the following equations:

$$0.02 \leq C/(A+B+C+D) < 0.5$$

and $$0.1 \leq D/C \leq 1.$$

* * * * *